United States Patent
Andre et al.

(10) Patent No.: US 9,230,633 B2
(45) Date of Patent: *Jan. 5, 2016

(54) MEMORY DEVICE WITH TIMING OVERLAP MODE

(71) Applicant: Everspin Technologies, Inc., Chandler, AZ (US)

(72) Inventors: Thomas Andre, Austin, TX (US); Syed M. Alam, Austin, TX (US); Halbert S Lin, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/595,568

(22) Filed: Jan. 13, 2015

(65) Prior Publication Data

US 2015/0124524 A1 May 7, 2015

Related U.S. Application Data

(63) Continuation of application No. 14/049,844, filed on Oct. 9, 2013, now Pat. No. 8,976,610.

(60) Provisional application No. 61/712,552, filed on Oct. 11, 2012.

(51) Int. Cl.
| | | |
|---|---|---|
| *G11C 7/00* | (2006.01) | |
| *G11C 11/16* | (2006.01) | |
| *G11C 7/10* | (2006.01) | |
| *G11C 7/22* | (2006.01) | |
| *G11C 7/12* | (2006.01) | |
| *G11C 11/4076* | (2006.01) | |

(52) U.S. Cl.
CPC .......... *G11C 11/1693* (2013.01); *G11C 7/1042* (2013.01); *G11C 7/22* (2013.01); *G11C 7/12* (2013.01); *G11C 11/4076* (2013.01)

(58) Field of Classification Search
CPC ...... G11C 7/22; G11C 11/4076; G11C 7/222; G11C 5/145; G11C 7/12; G11C 11/1693
USPC .......... 365/203, 194, 189.11, 189.16
See application file for complete search history.

(56) References Cited

U.S. PATENT DOCUMENTS

| | | | |
|---|---|---|---|
| 5,025,421 A | 6/1991 | Cho | |
| 7,436,719 B2 | 10/2008 | Yun | |
| 7,826,292 B2* | 11/2010 | Wilson et al. | 365/203 |
| 8,976,610 B2* | 3/2015 | Andre et al. | 365/203 |
| 2004/0001351 A1 | 1/2004 | Subramanian et al. | |

(Continued)

OTHER PUBLICATIONS

Office action for U.S. Appl. No. 14/049,844, mailed on Jul. 29, 2014, Andre et al., "Memory Device With Timing Overlap Mode", 6 pages.

(Continued)

*Primary Examiner* — David Lam
(74) *Attorney, Agent, or Firm* — Lee & Hayes, PLLC

(57) ABSTRACT

In some examples, a memory device is configured to receive a precharge command and an activate command. The memory device performs a first series of events related to the precharge command in response to receiving the precharge command and a second series of events related to the activate command in response to receiving the activate command. The memory device delays the start of the second series of events until the first series of events completes.

20 Claims, 5 Drawing Sheets

(56) References Cited

U.S. PATENT DOCUMENTS

2010/0271888 A1  10/2010  Rajan et al.
2011/0138094 A1  6/2011  Honta
2012/0127809 A1  5/2012  Ko

OTHER PUBLICATIONS

International Search Report and Written Opinion for International Application No. PCT/US2013/064088, mailed on Apr. 21, 2014, 2 pages.

* cited by examiner

MEMORY DEVICE WITH TIMING OVERLAP MODE

RELATED APPLICATION

This application is a continuation of, and claims priority to, pending U.S. application Ser. No. 14/049,844, now U.S. Pat. No. 8,976,610 filed on Oct. 9, 2013, entitled, Memory Device with Timing Overlap Mode, which claims priority to U.S. Provisional Application No. 61/712,552 to Andre et al., entitled "tRP Overlap Mode," filed Oct. 11, 2012, all of which are incorporated herein by reference in their entirety.

BACKGROUND

In some types of memory devices, such as random access memories (RAM), a predetermined series of commands are received from a source attempting to access the memory device. Following receipt of each command, a set of operations related to each of the commands are performed subject to strict timing requirements with no overlap.

Unfortunately, the memory device has no control over when the commands are received, as the commands are generated by the external source. Thus, the timing constraints of the memory device are designed to match the timing constraints of the external sources compatible with the memory device in order to avoid errors.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
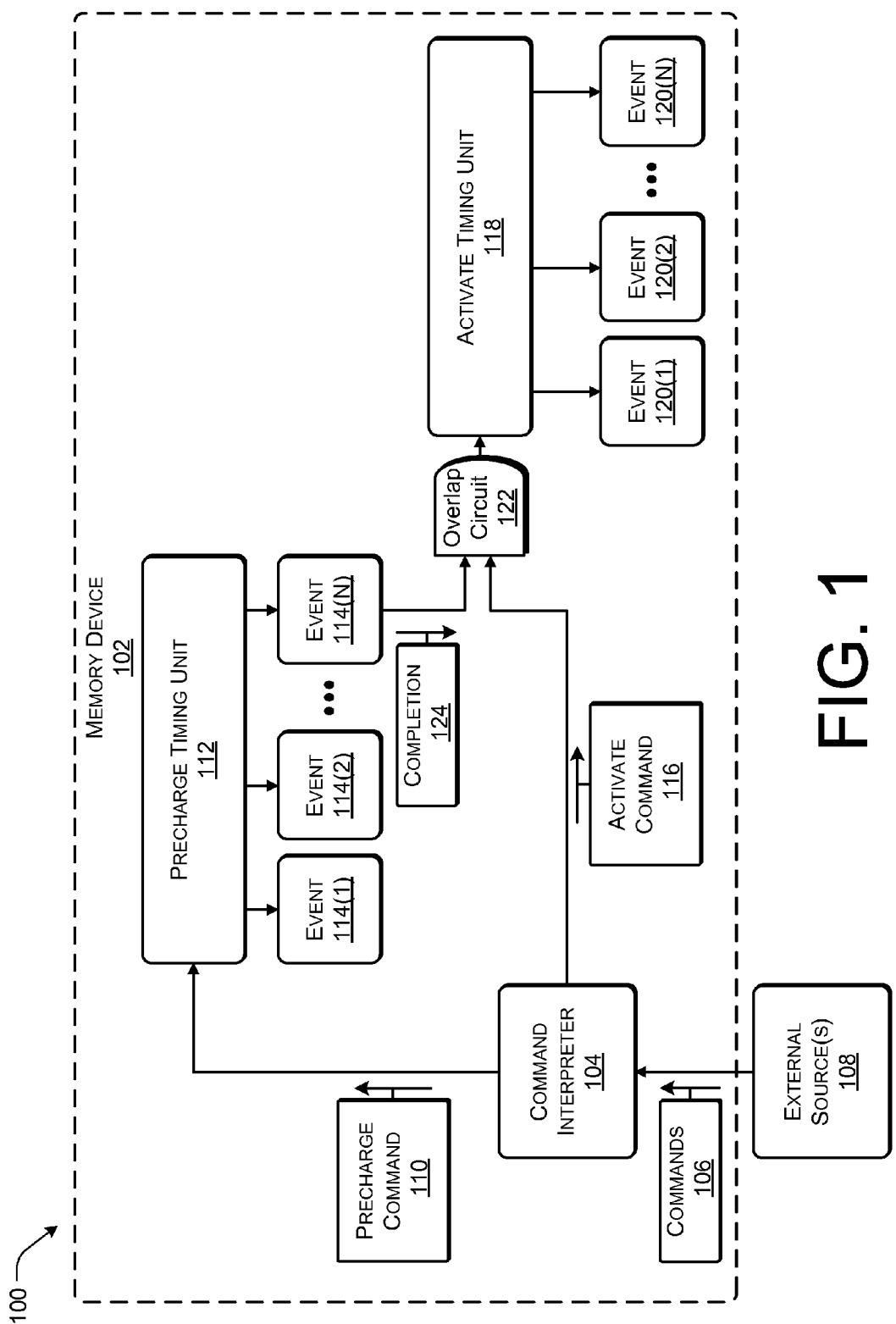
FIG. 1 illustrates select components of an example system including a memory device to receive a command while executing an operation, according to some implementations

This disclosure includes techniques and implementations to improve flexibility associated with performing read and write operations on a memory device. In some implementations, the memory device is configured to receive an activate command from an external source, before completion of operations associated with a precharge command. For example, in typical memory devices, a predetermined series of commands and operations are received and performed in sequence to accomplish one or more read and/or write operations. The series of commands and operations include a precharge command and precharge operations to close an open page within the memory array (for instance, writing the contents of the cache associated with a previous read or write operation to the memory array). The series of commands also includes an activate command and activate operations to open a page in the memory array and load the associated page to the cache and one or more read and/or write commands to edit the contents of the page while stored in the cache.

Each of the operations are typically performed in sequence with no overlap to avoid errors and/or collisions in the cache. The execution of each set of operations is also subject to timing requirements following the receipt of the corresponding command by the memory device. In general, an external source reading or writing data to the page first issues the precharge command to the memory device and then waits for a first period of time to elapse before issuing the activate command. This first period of time is typically referred to as row precharge time (tRP) and represents the number of clock cycles available to the memory device to complete the operations associated with the precharge command (i.e., the number of clock cycles between receiving the precharge command and receiving the activate command at the memory device).

After the first period of time elapses, the external source issues the activate command which is received by the memory device. The external source then waits for a second period of time before issuing at least one read or write command. This second period of time is typically referred to as row address to column address delay (tRCD) and represents the number of clock cycles available to the memory device to complete the operations associated with the activate command (i.e., the number of clock cycles between receiving the activate command and receiving at least one read or write command at the memory device).

As described above, the periods tRP and tRCD are governed by the external source accessing the memory device, as the external source accessing the memory device issues the precharge, activate, and read/write commands. While many of the external sources include registers that may be used to program delays corresponding to the number of clock cycles associated with the periods tRP and tRCD to better accommodate different types of memory devices, the delays are often limited to a maximum number of clock cycles. Moreover, in some cases, the maximum number of clock cycles for one of the delays (tRP or tRCD) may be insufficient. In particular, magnetic random access memory (MRAM) devices may require more clock cycles to perform the precharge operations than other types of memory devices.

In some implementations, the memory devices described herein are configured to be able to receive an activate command from an external source, before completion of operations associated with the precharge command in order to increase the number of clock cycles available to the memory device to complete the precharge operations. For instances, the memory devices may be configured to utilize both the clock cycles assigned to the time period tRP to perform the precharge operations and the clock cycles assigned to the time period tRCD to perform the activate operations as a combined time period tRP+tRCD to complete both the precharge operations and the activate operations. For example, the memory device may include a command interpreter configured to receive the precharge and activate commands, as well as, read and/or write commands from one or more external sources. The memory device also includes an overlap circuit (such as an AND gate) configured to delay the execution of the operations associated with the activate command until both the activate command and a completion signal from a precharge timing circuit are received. In this manner, the memory device is able to receive the activate command, while the operations associated with the precharge command are still being performed. Thus, the present disclosure may allow the memory device to be utilized in a greater number of systems and to be accessed by additional types of external sources.

In one example, tRP may be limited to a maximum number of 15 clock cycles, while tRCD may be limited to a maximum number of 200 clock cycles. In this example, assume that the memory device requires more clock cycles than the maximum number of clock cycles associated with the period tRP to complete the precharge operations, for instance, 30 clock cycles, while less than the maximum number of clock cycles associated with the period tRCD to complete activate operations, for instance, 100 clock cycles. Since the memory device requires 30 clock cycles to complete the precharge operations and 100 clock cycles to complete the activate operations, the external source may be programmed or configured to issue the precharge command to the memory device and to wait the maximum number of clock cycles, i.e., the 15 clock cycles before issuing the activate command. The external source may also be programmed or configured to wait 115 clock cycles before issuing a read or write command, i.e., the 100 clock cycles necessary to perform the activate operations and the remaining 15 clock cycles to finish the precharge operations.

In this example, the memory device may be configured to receive both the precharge and activate commands, but to prevent the activate operations from initiating until the precharge operations are complete. For instance, the memory device is able to receive the precharge command and begin the precharge operations. At the $15^{th}$ clock cycle, the memory device then receives the activate command and during the $30^{th}$ clock cycle completes the precharge operations. Also during the $30^{th}$ clock cycle, the memory device begins the activation operations, which are completed before the external source issues a read or write command at the $130^{th}$ clock cycle. In this way, the memory device has a total clock cycle period (tRP+tRCD) of 130 clock cycles to perform both the precharge operations and the activation operations regardless of the individual maximum timing constrains for tRP or tRCD imposed by the external source.

FIG. 1 illustrates select components of an example system 100 including a memory device 102 able to receive a command while executing an operation, according to some implementations. The memory device 102 is an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, RAID storage systems, storage arrays, network attached storage, storage area networks, cloud storage, or any other medium that can be used to store information. In one particular example, the memory device may be a magnetic memory or magnetic disk storage, such as an MRAM device.

The memory device 102 includes a command interpreter 104 configured to receive commands 106 (e.g., precharge, activation, and read/write commands) from at least one external source 108. The command interpreter 104 is further configured to provide a received precharge command 110 to a precharge timing unit 112 for initiating events 114(1)-(N) associated with the precharge operations and to provide a received activate command 116 to an activate timing unit 118 through overlap circuit 122 for initiating events 120(1)-(N) associated with the activation operations.

The external source 108 may be a circuit of the system 100 which is configured to access (e.g., read from and/or write to) the memory device 102. The external source 108 may be a general purpose processor, a central processing unit, a graphical processing unit, or one or more control circuits, among other possible circuits of the system 100. In some cases, the external source 108 may include more than one processor, such as multi-core processors and/or multiple circuits.

The precharge timing unit 112 is configured to control the start of each of the events 114(1)-(N) associated with one or more of operations related to the precharge command 110. For example, the precharge timing unit 112 may be configured to detect a precharge command 110 and, in response, to initiate event 114(1), wait for a first predetermined delay to elapse, and, in response, to initiate event 114(2). The precharge timing unit 112 then waits for a second predetermined delay to elapse and, in response, initiates event 114(3), and so forth. In some implementations, each of the predetermined delays may be the same duration. In other implementations, the time associated with the first predetermined delay may vary from the time associated with the second predetermined delay. For instance, the duration of the first predetermined delay may be related to the type of operations performed during event 114(1), while the duration of the second predetermined delay may be related to the type of operations performed during event 114(2).

The events 114(1)-(N) are a sequence of operations initiated by the precharge timing unit 112 for closing an open page in the memory device 102. For instance, the memory device 102 may be configured to perform row operations and to read an entire page (or row) from one of the memory banks (or arrays) and store the page in a cache, such that multiple read and/or write operations may be issued from the external source 108 to edit or update the contents of the page. In this instance, the events 114(1)-(N) associated with the precharge operations may cause the page currently stored in the cache to be written back to the memory bank (or array) from which the page (or row) was originally read in order to preserve changes made to the page while the page was stored in the cache. For example, the events 114(1)-(N) may be operations associated with setting a word line voltage level, a column select operation, a write back operation, or a word line and/or column select disable.

The activate timing unit 118 is configured to control the start of each of the events 120(1)-(N) associated with one or more of the activate operations. For example, the activate timing unit 118 may be configured to detect an activate command 116 and, in response, to initiate event 120(1), wait for a first predetermined delay to elapse and, in response, to initiate event 120(2). The activate timing unit 118 then waits for a second predetermined delay to elapse and, in response, initiates event 120(3), and so forth. In some implementations, each of the predetermined delays may be the same duration. In other implementations, the time associated with the first predetermined delay may vary from the time associated with the second predetermined delay. For instance, the duration of the first predetermined delay may be related to the type of operations performed during event 120(1) and the duration of the second predetermined delay may be related to the type of operations performed during event 120(2).

The events 120(1)-(N) are a sequence of operations initiated by the activate timing unit 118 for loading a page (or row) into the cache of the memory device 102 prior to the command interpreter 104 receiving a read/write command associated with the page. For instance, as discussed above, the memory device 102 may be configured to perform row operations to read an entire page (or row) from one of the memory banks (or arrays) and store the page in a cache. In this instance, the events 120(1)-(N) associated with the activation operations may cause the memory device 102 to load a new page (or row) into the cache. For example, the events 120(1)-(N) may be associated with setting a word line voltage level, a column select operation, a read sample operation, applying a reset voltage to a bit line or source line, read evaluate operation, or a word line and/or column select disable operation.

The memory device 102 also includes an overlap circuit 122. The overlap circuit 122 receives the activate command 116 from the command interpreter 104 and a completion signal 124 from the precharge timing unit 112 following the completion of the last event 114(N) associated with the precharge command 110. The overlap circuit 122 is configured to prevent the activate timing unit 118 from initiating the events 120(1)-(N) associated with the activate operations until the events 114(1)-(N) associated with the precharge command 110 have been completed and the activate command 116 is received from the external source 108. For example, the overlap circuit 122 may be an AND gate that activates upon the receipt of both the activate command 116 and the completion signal 124.

In some implementations, the completion signal 124 is generated by the precharge timing unit 112 upon the expiration of a predetermined delay associated with the last event 114(N). In other implementations, the precharge timing unit 112 may not generate the completion signal 124 directly, rather the completion signal 124 may be generated as part of event 114(N).

In general, when the external source 108 attempts to read data from or write data to the memory device 102, the external source 108 issues the precharge command 110 and waits for a predetermined number of clock cycles associated with a period tRP. The command interpreter 104 of the memory device 102 receives the precharge command 110 and starts the associated precharge operations by providing the precharge command 110 to the precharge timing unit 112.

The precharge timing unit 112 initiates events 114(1)-(N) based on clock signals and predetermined delays associated with each of the events 114(1)-(N). In some instances, the first period tRP expires before the events 114(1)-(N) are completed and the external source 108 issues the activate command 116 and proceeds to wait a number of clock cycles associated with a second period tRCD. For example, the first period tRP may be set to a maximum of 15 clock cycles but the events 114(1)-(N) require up to 30 clock cycles to complete. In this instance, the command interpreter 104 provides the activate command 116 to the overlap circuit 122. However, the overlap circuit 122 does not cause the activate timing unit 118 to initiate events 120(1)-(N) associated with the activate operations until the overlap circuit 122 receives the completion signal 124 from the precharge timing unit 112.

The precharge timing unit 112 continues to start events 114(1)-(N) until each of the events 114(1)-(N) have finished. After the events have finished, the precharge timing unit 112 provides the completion signal 124 to the overlap circuit 122. For instance, the overlap circuit 122 may receive the completion signal 124 following the 30$^{th}$ clock cycle (i.e., the number of clock cycles required to complete the precharge operations in the example above). Once the overlap circuit 122 receives the completion signal 124 and the activation command 116, the overlap circuit 122 causes the activate timing unit 118 to initiate events 120(1)-(N).

At some time after the events 120(1)-(N) are completed, the external source 108 begins to issue read and write commands related to the page loaded into the cache during the execution of the activate operations. For example, the second period tRCD may be set to 130 clock cycles and the events 120(1)-(N) may require 100 clock cycles to complete. In this example, the external source 108 waits a total of 145 clock cycles after the precharge command before issuing a read or write command. During the 145 clock cycles, the events 114(1)-(N) are performed utilizing the first 30 clock cycles and the events 120(1)-(N) are performed utilizing the next 100 clock cycles. Thus, in this example, 130 clock cycles of the 145 clock cycles are utilized to perform the precharge and activate operations in order to prepare the cache of the memory device 102 for receiving read and write accesses.

Therefore, it should be understood that by incorporating the overlap circuit 122 into the memory device 102, the memory device 102 is able to allocate the clock cycles associated with both the first and second periods (tRP+tRCD) to either the precharge operations or the activate operations, thereby increasing the number of external sources 108 that may utilize the particular memory device 102.

Figure 2:
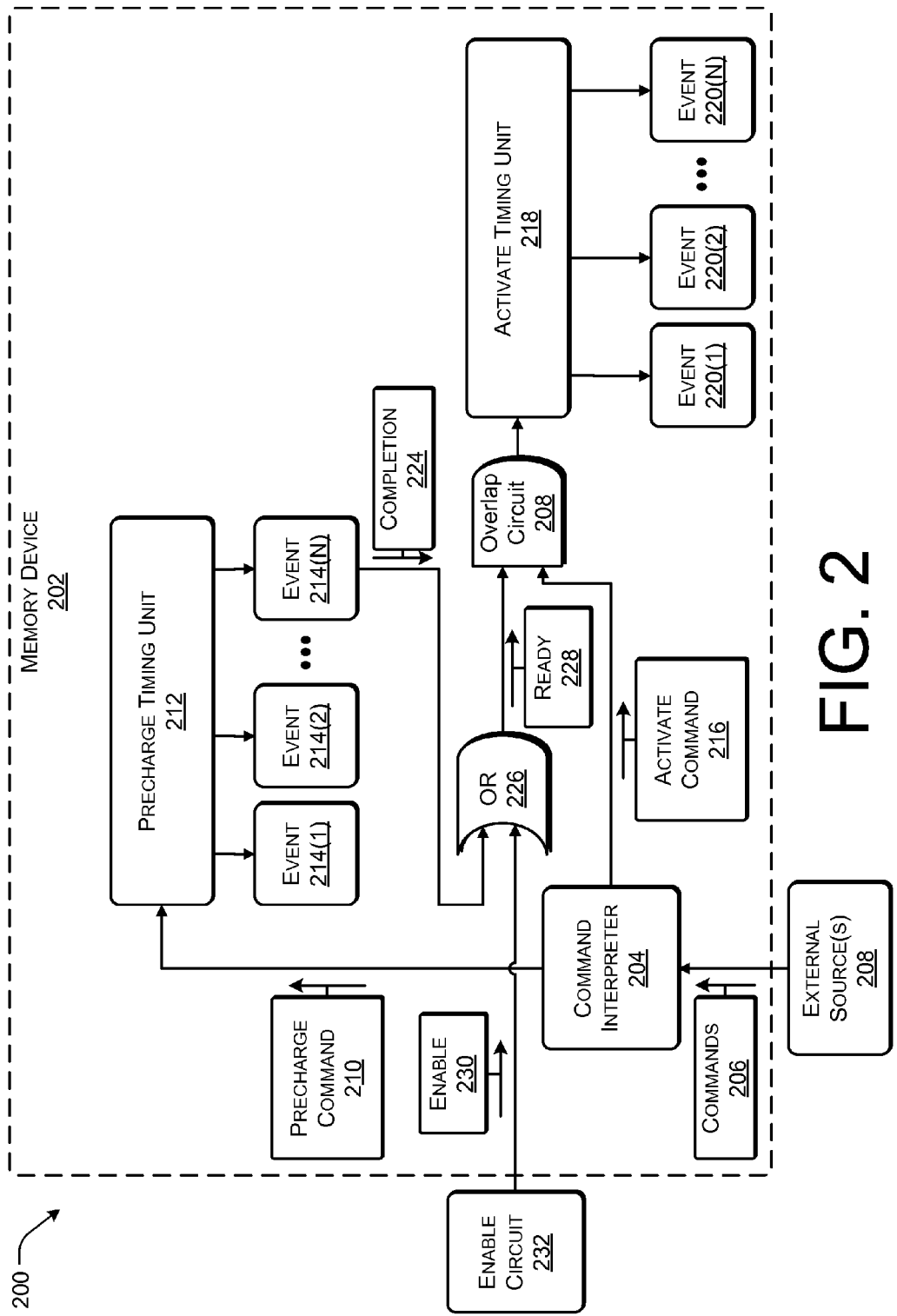
FIG. 2 illustrates select components of another example system including a memory device to receive a command while executing an operation, according to some implementations

FIG. 2 illustrates select components of another example system 200 including a memory device 202 able to receive a command while executing an operation according to some implementations. The memory device 202 includes a command interpreter 204 configured to receive commands 206 (e.g., precharge, activation, and read/write commands) from an external source 208 (e.g., a processor or control circuit). The command interpreter 204 is further configured to provide a precharge command 210 to a precharge timing unit 212 for processing events 214(1)-(N) associated with the precharge operations and to provide the activate command 216 to an activate timing unit 218 through an overlap circuit 208 for processing events 220(1)-(N) associated with the activation operations.

The external source 208 is a circuit of the system 200 that may be configured to access (e.g., read from and/or write to) the memory device 202. The external source 208 may be a general purpose processor, a central processing unit, a graphical processing unit, or one or more control circuits, among other possible circuits of the system 200. In some cases, the external source 208 may include more than one processor, such as multi-core processors and/or multiple circuits.

The precharge timing unit 212 is configured to control the start of each of the events 214(1)-(N) associated with one or more operations related to the precharge command 210. For example, the precharge timing unit 212 may be configured to detect a precharge command 210 and, in response, to initiate event 214(1), wait for a first predetermined delay to elapse and, in response, to initiate event 214(2). The precharge timing unit 212 then waits for a second predetermined delay to elapse and, in response, initiates event 214(3), and so forth. In some implementations, each of the predetermined delays may be the same duration. In other implementations, the time associated with the first predetermined delay may vary from the time associated with the second predetermined delay. For instance, the duration of the first predetermined delay may be related to the type of operations performed during event 214(1), while duration of the second predetermined delay may be related to the type of operations performed during event 214(2).

The events 214(1)-(N) are a sequence of operations initiated by the precharge timing unit 212 for closing an open page in the memory device 102. For instance, the memory device 202 may be configured to perform row operations to read an entire page (or row) from one of the memory banks (or arrays) and store the page in a cache, such that multiple read and/or write operations associated with the page may be issued from the external source 208. In this instance, the events 214(1)-

(N) associated with the precharge operations may cause the page currently stored in the cache to be written back to the memory bank from which the page (or row) was originally read to preserve changes made while the page was stored in the cache. For example, the events 214(1)-(N) may be associated with setting a word line voltage level, a column select operation, a write back operation, or a word line and/or column select disable.

The activate timing unit 218 is configured to control the start of each of the events 220(1)-(N) associated with one or more of the activate operations. For example, the activate timing unit 218 may be configured to detect an activate command and, in response, to initiate event 220(1), wait for a first predetermined delay to elapse and, in response, to initiate event 220(2). The activate timing unit 218 then waits for a second predetermined delay to elapse and, in response, initiates event 220(3), and so forth. In some implementations, each of the predetermined delays may be the same duration. In other implementations, the duration of the first predetermined delay may vary from the duration of the second predetermined delay. For instance, the duration of the first predetermined delay may be related to the type of operations corresponding to the event 220(1) and the duration of the second predetermined delay may be related to the type of operations corresponding to the event 220(2).

The events 220(1)-(N) are a sequence of operations initiated by the activate timing unit 218 for loading a page (or row) into the cache of the memory device 202 prior to the command interpreter 204 receiving a read/write command. For instance, as discussed above, the memory device may be configured to perform row operations to read an entire page (or row) from one of the memory banks (or arrays) and store the page in a cache. In this instance, the events 220(1)-(N) associated with the activation operations may cause the memory device 202 to load a new page (or row) into the cache. For example, the events 220(1)-(N) may be associated with setting a word line voltage level, a column select operation, a read sample operation, applying a reset voltage to a bit line or source line, read evaluate operation, or a word line and/or column select disable operation.

In the example of FIG. 2, the memory device 202 also includes an OR gate 226. The OR gate 226 is configured to generate a ready signal 228 in response to receiving either an enable signal 230 from an enable circuit 232 or a completion signal 224 from the precharge timing unit 212. The completion signal 224 indicates that the last of the events 214(1)-(N) is complete, while the enable signal 230 is utilize as an override to start the events 220(1)-(N) associated with the activate operations earlier than would be the case in the memory device 102 of FIG. 1. In some implementations, the enable circuit 232 is incorporated into the memory device 202, while in others the enable circuit 232 is an external circuit, as illustrated in FIG. 2.

The memory device 202 also includes an overlap circuit 222 that receives the ready signal 228 from the OR gate 226. The overlap circuit 222 also receives the activate command 216 from the command interpreter 204. The overlap circuit 122 is configured to prevent the activate timing unit 218 from initiating the events 220(1)-(N) associated with the activate operations until events 214(1)-(N) are complete or the enable circuit 232 provides the enable signal 230 (e.g., an override signal) and the activate command 216 has been received from the external source 208. For example, the overlap circuit 222 may be an AND gate that activates upon the receipt of both the activate command 216 and the ready signal 228.

In general, for the external source 208 to read data from or write data to the memory device 202, the external source 208 issues the precharge command 210 and waits a number of clock cycles assigned to a first period tRP. The command interpreter 204 of the memory device 202 receives the precharge command 210 and initiates the precharge operations by providing the precharge command 210 to the precharge timing unit 212.

The precharge timing unit 212 initiates events 214(1)-(N) based on clock signals and predetermined delays associated with each of the events 214(1)-(N). In some instances, the first period tRP expires before the events 214(1)-(N) are completed and the external source 208 issues the activate command 216 and a number of clock cycles assigned to a second period tRCD. For example, the first period tRP may be set to a maximum of 30 clock cycles but the events 214(1)-(N) require 45 clock cycles to complete. In this instance, the command interpreter 204 provides the activate command 216 to the overlap circuit 222. However, the overlap circuit 222 does not cause the activate timing unit 218 to begin events 220(1)-(N) associated with the activate operations, as the ready signal 228 has not been received from the OR gate 226.

The OR gate 226 provides the ready signal 228 upon either receiving the completion signal 224 from the precharge timing unit 212 following the completion of the events 214(1)-(N) or upon receiving the enable signal 230. Once the OR gate 226 provides the overlap circuit 222 the ready signal 228, the overlap circuit 222 causes the activate timing unit 218 to begin the events 220(1)-(N) when the activate command 216 has been received.

Sometime after the events 220(1)-(N) are completed, the external source 208 begins to issue read and write commands related to the page loaded into the cache during the execution of the activate operations. For example, the second period tRCD may be set to 115 clock cycles and the events 220(1)-(N) may require 100 clock cycles to complete. In this example, the external source 208 waits 145 clock cycles after the precharge command before issuing a read or write command. During the 145 clock cycles, the events 214(1)-(N) are performed utilizing the first 45 clock cycles and the events 220(1)-(N) are performed utilizing the next 100 clock cycles. Thus, in this example, the memory device 202 is able to perform each event related to the precharge operations and each event rated to the activate operations without causing collisions in the cache or other errors, even though the period tRP is insufficient for performing operations associated with events 114(1)-(N).

Therefore, it should be understood that by incorporating the overlap circuit 222 into the memory device 202, the memory device 202 is able to allocate the clock cycles associated with both the first period tRP and second periods tRCD as a combined period tRP+tRCD to either the precharge operations or the activate operations increasing the flexibility available to the memory device manufactures.

Figure 3:
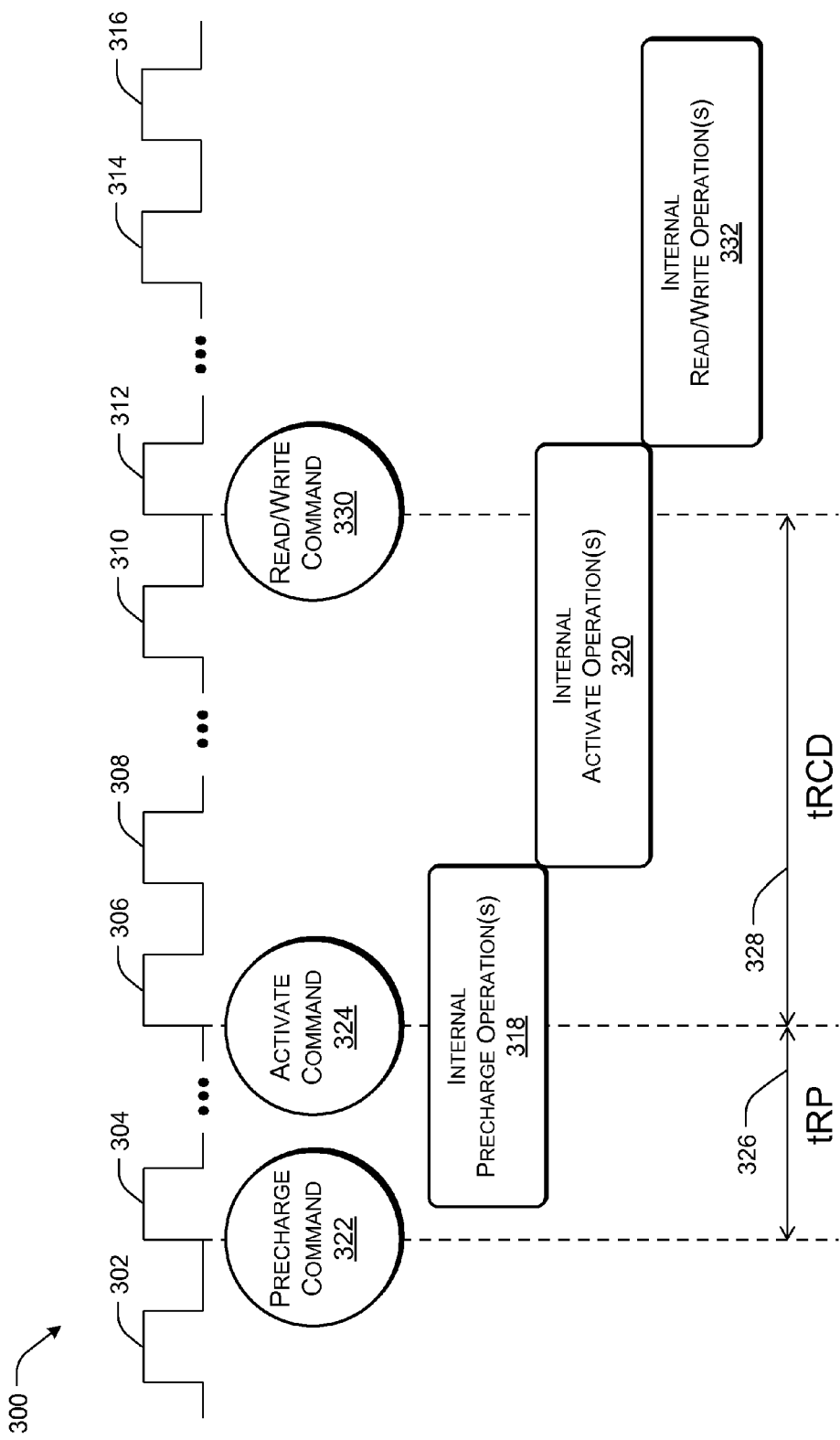
FIG. 3 illustrates a timing diagram associated with the memory devices of FIGS. 1 and 2, according to some implementations.

FIGS. 1 and 2 provides example architectures for memory devices associating to some implementations. FIG. 3 provides a timing diagram to better illustrate the operations associated with the precharge command, the activate command, and at least one read or write command.

FIG. 3 illustrates a timing diagram 300 associated with a memory device, such as memory devices 102 and 202 of FIGS. 1 and 2 according to some implementations. The timing diagram 300 illustrates events associated with an external source accessing one page of data stored in the memory device from the perspective of the memory device. The timing diagram 300 is illustrated based on clock cycles and includes illustrated clock cycles 302-316. It should be understood that a length of time between each of the clock cycles and a total number of clock cycles is an implementation detail and that, as illustrated, additional clock cycles may exist between clock cycles 304 and 306, clock cycles 308 and 310, and clock cycles 312 and 314.

In the illustrated example, the memory device is configured to utilize the combined period tRP+tRCD (illustrated as 326 and 328, respectively) to complete both the internal precharge operations 318 and the internal activate operations 320, while avoiding collisions in the cache and other errors. As illustrated, the memory device receives the precharge command 322 from the external source on the rising edge of clock cycle 304. In response, the memory device begins to perform internal precharge operations 318 (e.g., events 114(1)-(N) and 214(1)-(N) of FIGS. 1 and 2). Receipt of the precharge command 322 also starts the period tRP 326 (i.e., the number of clock cycles the external source waits before issuing the activate command 324). As illustrated, the internal precharge operations 318 are not complete until the clock cycle 308 and the activate command 324 is received following the expiration of the period tRP 326, during clock cycle 306.

However, rather than starting the internal activate operations 320 in response to receiving the activate command 324, the memory device delays the start of the internal activate operations 320 until the internal precharge operations 318 are completed (i.e., during clock cycle 308). For example, the memory device may be equipped with an AND gate which controls the execution of the internal activate operations 320 based on both the activate command 324 and a completion signal associated with the internal precharge operations 318. In this way, the memory device is able to avoid a collision that would otherwise result from the internal precharge operations 318 writing a first page stored in the cache of the memory device to one of the memory banks (or arrays), while the internal activate operations 320 are writing a second page from another one of the memory banks (or arrays) into the cache, as the activate command 324 is received prior to the completion of the internal precharge operations 318.

When the activate command 324 is received, the period tRCD 328 that the external source waits before issuing a read/write command 330 begins. During the period tRCD 328, the internal precharge operations 318 are completed and, upon completion of the internal precharge operations 318 (during clock cycle 308), the internal activate operations 320 are initiated. In the illustrated example, the read/write command 330 is received on the rising edge of clock cycle 312. However, as illustrated in FIG. 3, the internal activate operations 320 are not complete with in the period tRCD 328. The extension of the internal activate operations 320 past the period tRCD 328 illustrates the fact that the memory device may experience a short delay between receiving the internal read/write command 330 and beginning the read/write operation 332.

Figure 4:
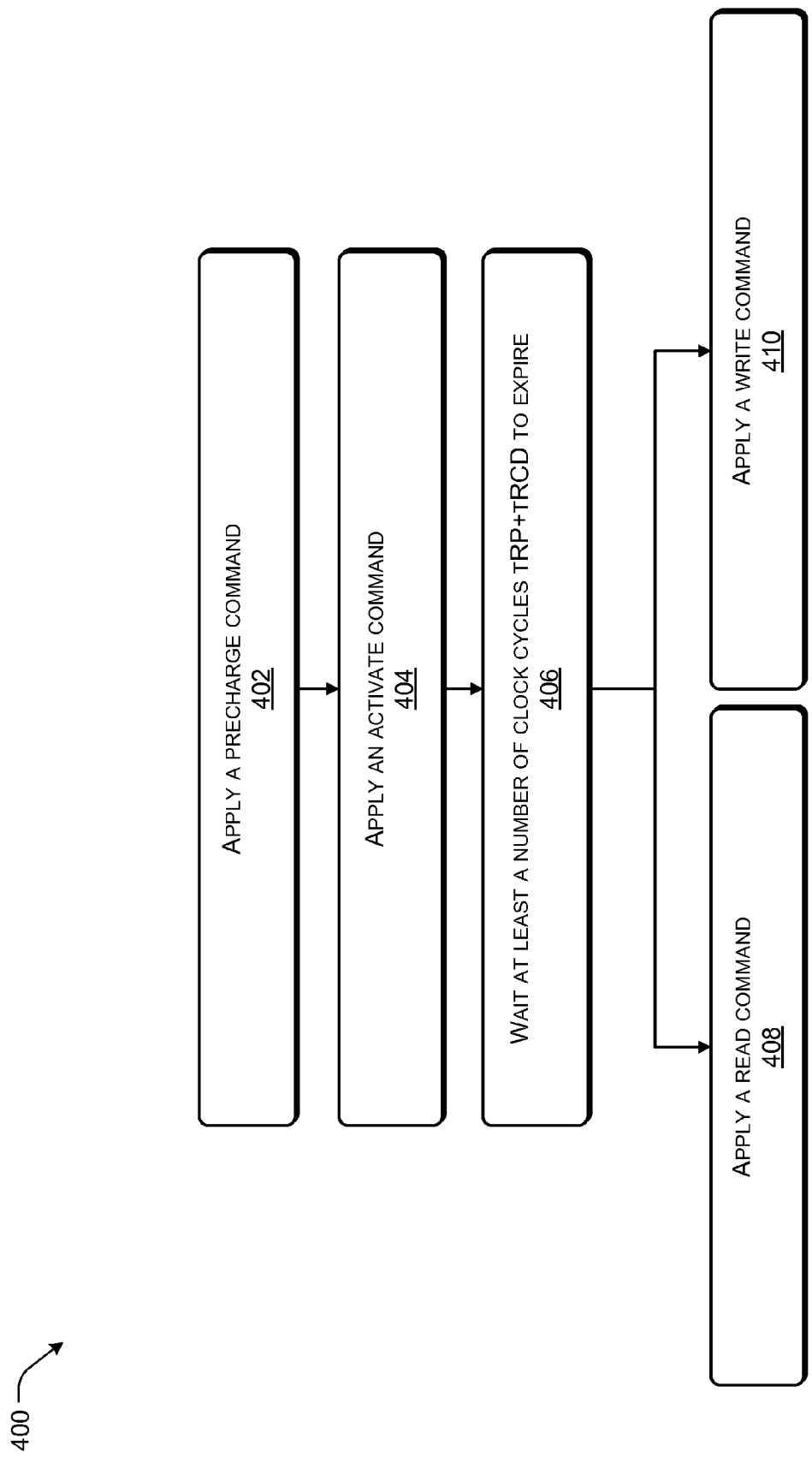
FIG. 4 illustrates an example flow diagram showing an illustrative process for receiving overlapping commands, according to some implementations.
Figure 5:
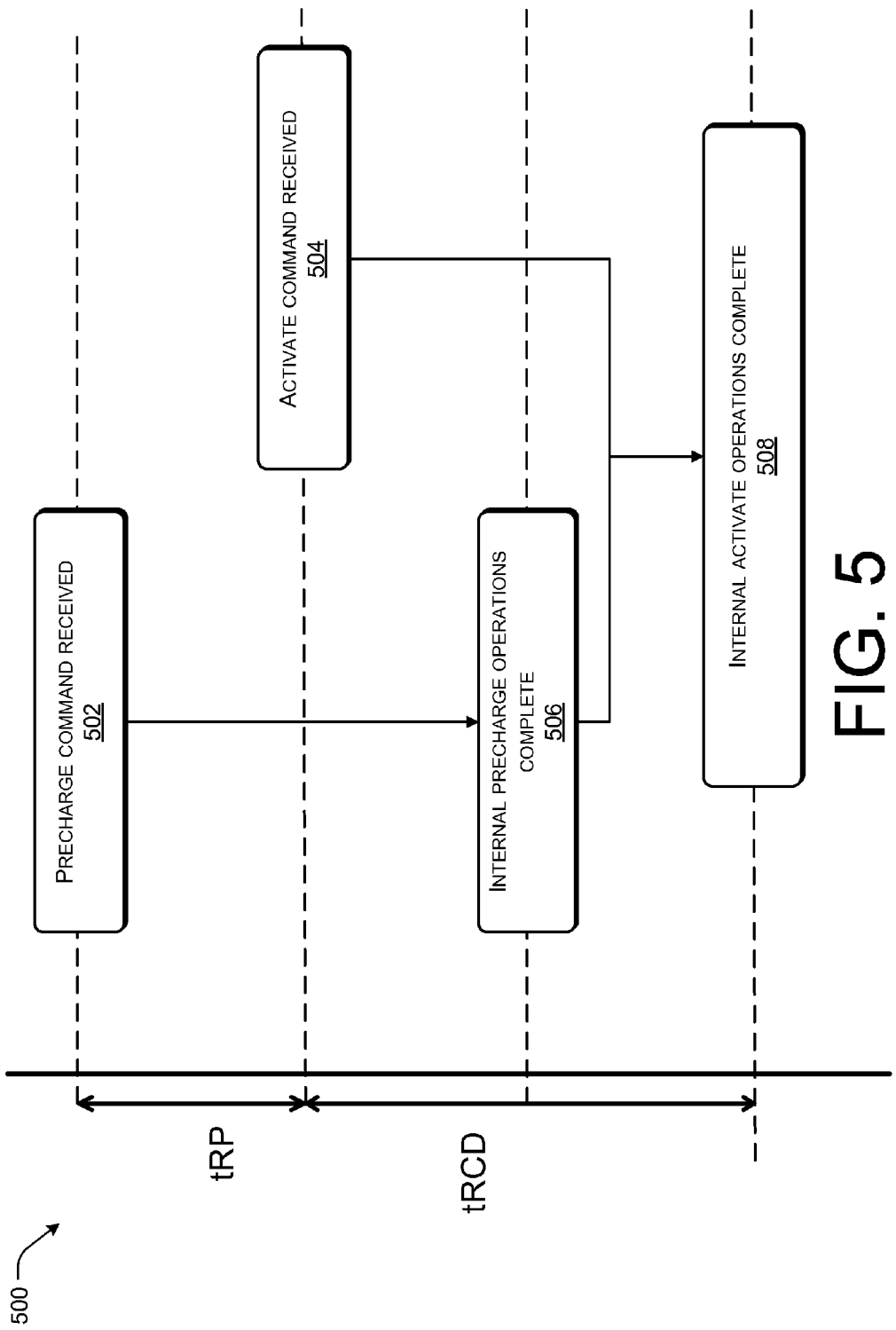
FIG. 5 illustrates a partial flow diagram and a partial timing diagram showing an illustrative process for receiving overlapping commands, according to some implementations.

FIGS. 4 and 5 are flow diagrams illustrating example processes of memory devices capable of receiving overlapping commands. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 4 illustrates an example flow diagram showing an illustrative process 400 for applying overlapping commands, according to some implementations. At 402, a precharge command is applied to a memory device (such as the memory devices 102 and 202 of FIGS. 1 and 2), for instance, from an external source (e.g. the external sources 108 and 208 of FIGS. 1 and 2). In general, when the memory device receives the precharge command, the memory device performs the precharge operations or the operations associated with closing an open page in the memory device. For example, the memory device may perform one or more operations associated with writing the contents of the cache to a memory bank (or array) of the memory device in order to save changes made to the page while stored in the cache.

At 404, an activate command is applied to the memory device, for instance, from the external source. In general, when the memory device receives the activate command, the memory device performs the activate operations or the operations associated with reading a page to the cache of the memory device. For example, the memory device may perform one or more operations associated with selecting a row (or page) from a memory bank (or array) and writing the contents of the row to the cache.

At 406, the memory device waits at least a number of clock cycles tRP+tRCD to expire. For example, in the memory device describe herein, the memory device utilizes the combined period tRP+tRCD to perform both the precharge operations and the activate operations, rather than utilizing the period tRP for the precharge operations and the period tRCD for the activate operations. For example, the memory device may require 30 clock cycles to complete the precharge operations and 100 clock cycles to complete the activate operations. The external source accessing the memory device, however, may be programmed to wait the maximum number of 15 clock cycles before issuing the activation command and 115 clock cycles before issuing a read or write command. The memory device is configured to receive both the precharge and activate commands, but to delay the activate operations until the precharge operations are complete. In this way, the memory device has a total of 130 clock cycles or the period tRP+tRCD to perform both the precharge operations and the activation operations even though the activation command is received before the completion of the precharge operations. In other words, the memory device is able to receive the precharge command, begin the precharge operations, receive the activation command following the end of the 15$^{th}$ clock cycle, complete the precharge operations, and following the end of the 30$^{th}$ clock cycle, begin the activation operations.

As shown at 408, a read command or, as shown at 410, a write command may be applied to the memory devices, for instance, from the external source. For example, if the external source is attempting to read data from the memory device, the external source applies a read command 408 and the memory device performs the read operation to read the requested data from the cache. If, however, the external source is attempting to write data to the memory device, the external source applies a write command 410 and the memory device performs the write operation to write the requested data into the cache.

FIG. 5 illustrates a partial flow diagram and partial timing diagram showing an illustrative process 500 for receiving overlapping commands, according to some implementations. At 502, a memory device (such as the memory devices 102 and 202 of FIGS. 1 and 2) receives a precharge command from an external source (e.g., the external sources 108 and 208 of FIGS. 1 and 2). In general, when the memory device receives the precharge command, the memory device performs the precharge operations or the operations associated with closing an open page in the memory device. For example, the memory device may perform one or more operations associated with writing the contents of the cache to a memory bank (or array) of the memory device in order to save changes made to the page while stored in the cache.

At the time the precharge command is received by the memory device, a first period tRP begins, as illustrated in FIG. 5. As described above, the period tRP is the number of clock cycles that the external source waits before issuing the activate command to the memory device or the number of clock cycles that are typically available to the memory device to complete the precharge operations (e.g., events 114(1)-(N) or events 214(1)-(N) of FIGS. 1 and 2).

At 504, a memory device receives an activate command from the external source. In general, when the memory device receives the activate command, the memory device performs the activate operations or the operations associated with writing a page to the cache of the memory device. For example, the memory device may perform one or more operations associated with selecting a row (or page) from a memory bank (or array) and writing the contents of the row to the cache. However, as illustrated in the example of FIG. 5, the memory device receives the activate command following the expiration of the period tRP but before the memory device completes the internal precharge operations (at 506).

At the time the activate command is received by the memory device, a second period tRCD begins, as illustrated in FIG. 5. As described above, the period tRCD is the number of clock cycles that the external source waits before issuing a read or write command to the memory device or the number of clock cycles available to the memory device to complete the activate operations (e.g., events 120(1)-(N) or events 220(1)-(N) of FIGS. 1 and 2).

At 506, the memory device completes the internal precharge operations. Since the activate command was received prior to the completion of the internal precharge operations, when the memory device completes the internal precharge operations, the memory device begins the internal activation operations. Thus, in the illustrated example, the memory device utilizes the period tRP as well as part of the period tRCD to perform the internal precharge operations. By waiting to start the internal activate operations until the completion of the internal precharge operations, both the precharge operations and the activate operations may be performed without an error occurring in the memory device.

At 508, the memory device completes the internal activate operations. In the illustrated example, the internal activate operations complete when the period tRCD expires. However, in other examples, the internal activate operations may complete before the expiration of the period tRCD. In this manner, the memory device is able to utilize the combined period tRP+tRCD as desired to complete the internal precharge operations and the internal activate operations. For example, the memory device is able to cause the internal precharge operations to overlap into the period tRCD, typically reserved for the internal activate operations.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A circuit comprising:
   a first component to receive a first signal associated with a first command and a second signal associated with a second command, the first signal to cause the circuit to initiate a first series of events associated with the first command and the second signal indicating to cause the circuit to initiate a second series of events associated with the second command; and
   an overlap component configured to delay the initialization of the first series of events until the second series of events associated with the second command are complete.

2. The circuit as recited in claim 1, wherein the first component is a command interpreter.

3. The circuit as recited in claim 1, further comprising a timing unit to initiate individual events of the second series of events.

4. The circuit as recited in claim 3, further comprising a second timing unit to initiate individual events of the first series of events.

5. The circuit as recited in claim 1, wherein the first command is an activate command.

6. The circuit as recited in claim 1, wherein the second command is a precharge command.

7. A circuit comprising:
   a precharge timing unit configured to perform a first series of events associated with a precharge command;
   an activate timing unit configured to perform a second series of events associated with an activate command; and
   wherein the first series of events and the second series of events are configured to complete before a period expires, the period representing a number of clock cycles that an external source waits after providing the precharge command plus a number of clock cycles the external source waits after providing the activate command.

8. The circuit as recited in claim 7, further comprising a command interpreter to receive and route the precharge command and the activate command from an external source.

9. The circuit as recited in claim 7, wherein at least one event of the first series of events associated with the precharge command is related to writing content of a cache into a memory bank of a memory device.

10. The circuit as recited in claim 7, wherein the at least one event related to the second series of events associated with the activate command is related to writing content of a memory bank of a memory device into a cache.

11. The circuit as recited in claim 7, further comprising an overlap circuit configured to delay the activate timing unit from performing the second series of events until the precharge timing unit completes the first series of events and the activate command is received.

12. A memory device comprising:
   a command interpreter for receiving and routing commands from an external source;
   a timing unit to receive a first command from the command interpreter; and
   an overlap circuit to receive a second command from the command interpreter, the overlap circuit to prevent an initiation of operations associated with the second command until a completion signal is received from the timing unit.

13. The memory device as recited in claim 12, wherein the first command is a precharge command.

14. The memory device as recited in claim 12, wherein the second command is an activate command.

15. The memory device as recited in claim 12, wherein the timing unit initiates individual events of a series of events associated with the first command.

16. The memory device as recited in claim 15, wherein at least one event of the series of events associated with the first command is related to writing content of a cache of the memory device into a memory bank of the memory device.

17. The memory device as recited in claim 12, further comprising an enable circuit for enabling and disabling the overlap circuit.

18. The memory device as recited in claim 12, wherein the overlap circuit is an AND gate.

19. The memory device as recited in claim 12, wherein the memory device is a magnetic memory device.

20. The memory device as recited in claim 12, wherein the external source includes at least one of:
- a processor;
- a multi-core processor;
- a central processing unit;
- a graphical processing unit;
- a general purpose processor; or
- a circuit external to the memory device.

* * * * *